(12) United States Patent
Hall

(10) Patent No.: US 12,216,165 B2
(45) Date of Patent: Feb. 4, 2025

(54) METHOD FOR CATEGORIZING PERFORMANCE OF AN ELECTRIC TRACTION MACHINE BEING A PERMANENT MAGNETIC SYNCHRONOUS MOTOR

(71) Applicant: VOLVO TRUCK CORPORATION, Gothenburg (SE)

(72) Inventor: Sebastian Hall, Hisings Backa (SE)

(73) Assignee: VOLVO TRUCK CORPORATION, Gothenburg (SE)

(*) Notice: Subject to any disclaimer, the term of this patent is extended or adjusted under 35 U.S.C. 154(b) by 497 days.

(21) Appl. No.: 17/643,548

(22) Filed: Dec. 9, 2021

(65) Prior Publication Data

US 2022/0196740 A1    Jun. 23, 2022

(30) Foreign Application Priority Data

Dec. 18, 2020    (EP) .................................... 20215480

(51) Int. Cl.
*G01R 31/34*    (2020.01)
*H02P 21/14*    (2016.01)
*H02P 21/20*    (2016.01)

(52) U.S. Cl.
CPC ............ *G01R 31/34* (2013.01); *H02P 21/141* (2013.01); *H02P 21/20* (2016.02); *H02P 2207/05* (2013.01)

(58) Field of Classification Search
CPC ..... G01R 31/34; H02P 21/20; H02P 2207/05; H02P 21/141
See application file for complete search history.

(56) References Cited

U.S. PATENT DOCUMENTS

2014/0232306 A1* 8/2014 Yasui .................... H02P 21/141
                                                        318/400.02
2015/0137720 A1    5/2015 Kobayashi et al.
(Continued)

FOREIGN PATENT DOCUMENTS

CN     107294450 A    10/2017
CN     108599638 B    12/2020
(Continued)

OTHER PUBLICATIONS

European Search Report dated Jun. 4, 2021 in corresponding European Patent Application No. 20215480.3, 5 pages.
(Continued)

*Primary Examiner* — Minh Q Phan
(74) *Attorney, Agent, or Firm* — Venable LLP; Jeffri A. Kaminski

(57) ABSTRACT

A method for categorizing performance of a PMSM coupled to a drive shaft, and powered by a battery via an inverter. The method comprising: decoupling the PMSM from drive shaft; performing a first retardation test to measure the flux linkage of the permanent magnets, PM flux, in the PMSM; performing a second retardation test in which the inverter is disconnected, to measure the no-load power losses of the PMSM; correlating the PM flux with the no-load power losses in a health parameter of the PMSM, and comparing the health parameter with reference data of known health parameters of a population of PMSMs; categorizing the performance of the PMSM based on the compared health parameter.

18 Claims, 3 Drawing Sheets

(56) References Cited

U.S. PATENT DOCUMENTS

2015/0372628 A1  12/2015  Oono
2017/0115168 A1   4/2017  Kim et al.
2017/0338765 A1  11/2017  Feng et al.
2018/0272893 A1   9/2018  Zing et al.
2019/0047549 A1   2/2019  Johri et al.

FOREIGN PATENT DOCUMENTS

DE   102016014160 A1   5/2017
KR    20120048122 A    5/2012
WO     2018202277 A1  11/2018

OTHER PUBLICATIONS

European Search Report dated Jun. 1, 2021 in corresponding European Patent Application No. 20215500.8, 8 pages.
Official Action dated Feb. 2, 2023 in related U.S. Appl. No. 17/643,303, 12 pages.

* cited by examiner

METHOD FOR CATEGORIZING PERFORMANCE OF AN ELECTRIC TRACTION MACHINE BEING A PERMANENT MAGNETIC SYNCHRONOUS MOTOR

TECHNICAL FIELD

The present invention relates to a method for categorizing performance of an electric traction machine being a permanent magnetic synchronous motor, PMSM. The invention further relates to a computer program comprising program code means for performing the method, a controlling apparatus for controlling the operation of a PMSM, an arrangement comprising a PMSM and a controlling apparatus, and to a vehicle.

BACKGROUND

A vehicle typically comprises an engine or machine for propelling the vehicle. The engine may be powered by various means, such as e.g. by a liquid or gaseous fuel in an internal combustion engine, or by electric power to an electric machine. Moreover, hybrid solutions exist in which e.g. the vehicle is propelled both by an internal combustion engine and an electric machine. In either way, an energy storage or energy transformation device, such as e.g. a battery, is used to provide the energy needed in order to propel the vehicle.

A specific type of an electric machine is a synchronous electric motor driven by alternating current (AC) for which, at steady state, the rotation of the rotor and the rotating shaft is synchronized with the frequency of the supply current. That is, the rotation period is equal to an integral number of AC cycles. The stator of the synchronous electric motor comprises multiphase AC electromagnets for creating a magnetic field which rotates in time with the oscillations of the line current. The rotor of the synchronous electric motor comprises permanent magnets or electromagnets and rotate with the magnetic field created by the stator.

When permanent magnets are used in the rotor, the synchronous electric motor is referred to as a permanent-magnet synchronous motor (PMSM). The permanent magnets (e.g. Neodymium magnets) are typically embedded in the rotor to create a constant magnetic field, and the stator comprises stator windings connected to the AC supply to produce the rotating magnetic field. At synchronous speed the rotor poles lock to the rotating magnetic field.

The characteristics of equally designed PMSMs differ slightly among one another. Various tests may be performed to determine the characteristic of a PMSM. For example, performance tests may be carried out just prior the production of the PMSM at the manufacturing site to verify that the PMSM operates within acceptable tolerances. Moreover, so called on-line tests, carried out after installation of the PMSM in the vehicle, and performed during normal operation of the PMSM may give information of e.g. peak temperatures in the PMSM. The magnetic field intensity of the permanent magnet reduces sharply and loss of magnetism may even occur if the temperature is exceed a critical temperature (the Curie temperature).

The operation of the PMSM with regards to the characteristic of the PMSM is important to know for various reasons as e.g. different permanent magnet materials have different characteristics. For example, the temperature characteristics may vary, and in general, the magnetic field intensity of a permanent magnet weakens linearly as temperature increases, and enhances linearly as the temperature decreases. Thus, by knowing the temperature characteristic of the PMSM, the efficiency or performance of the PMSM may be improved.

Even though the current tests, such as testing at the manufacturing site and on-line tests give important information of the PMSM characteristic, further improvements in the characterisation of the PMSM is needed.

SUMMARY

It is an object of the present invention to at least to some extent alleviate the shortcomings discussed above in relation to known PMSM and the characterisation thereof.

According to at least a first aspect of the present invention, a method for categorizing performance of an electric traction machine being a permanent magnetic synchronous motor, PMSM, the PMSM being coupled to a drive shaft, and powered by a battery via an inverter, is provided. The method comprising:

decoupling the PMSM from drive shaft;
performing a first retardation test to measure the flux linkage of the permanent magnets, PM flux, in the PMSM;
performing a second retardation test in which the inverter is disconnected, to measure the no-load power losses of the PMSM;
correlating the PM flux with the no-load power losses in a health parameter of the PMSM, and comparing the health parameter with reference data of known health parameters of a population of PMSMs;
categorizing the performance of the PMSM based on the compared health parameter.

Hereby, an effective way of categorizing the PMSM by comparing with reference data is provided. For example, a PMSM can be categorized based on too high no-load power losses as compared to the PM flux, or a PMSM can be categorized based on its likely hood of premature failure by comparing the health parameter with the known health parameters of the population of PMSMs, the latter comprising empirical data of health parameters indicating premature failures.

The method of the invention is advantageous as it may improve predictive maintenance of the PMSM. Consequently, it may enhance the reliability and the range of the vehicle. Furthermore, by the method, degradation of the drive train performance may be predicted before the vehicle becomes non-functional. That is, the results of the categorization of the performance of the PMSM provides e.g. changes in the internal losses of the PMSM, and a deviation compared to reference data of a population of similar PMSMs which can be detected early. Moreover, the health parameter may be used as a base-line value, or reference health parameter, for subsequent online-tests of the PMSM. The health parameter, both for the current PMSM and for the reference data, may e.g. be stored in a cloud database for tracking and optimization purposes.

According to at least one example embodiment, the method comprising determining the temperature of the PMSM, or at least the temperature of the permanent magnets of the PMSM, and correlating the PM flux to the temperature.

As the PM flux is typically dependent on the temperature of the PMSM, or the permanent magnets in the PMSM, including the temperature of the PM flux in the health parameter further improves the categorization of the PMSM. The determined temperature, and its correlation to the PM flux, may also be used as a reference temperature, and further used e.g. during online-test or online measurements (i.e. during normal operation of the PMSM) to estimate when the temperature may reach a point where the permanent magnets may be damaged, i.e. a critical temperature or Curie temperature.

According to at least one example embodiment, the method comprises:

prior to the first retardation test, determining a steady state temperature for the permanent magnets in the PMSM.

Hereby, the PM flux may be determined for a specific temperature, and any changes of the PM flux with regards to temperature changes may be neglected. This may further improve the categorization of the PMSM.

According to at least one example embodiment, the PMSM is coupled to the drive shaft via a gearbox, and the decoupling the PMSM from drive shaft, may comprise decoupling the PMSM from the gearbox.

According to at least one example embodiment, the method comprises:

measuring the temperature inside of the PMSM, e.g. in the stator windings of the PMSM, and the temperature outside of the PMSM, e.g. in the drive shaft or gearbox;

comparing the measured temperatures inside and outside of the PMSM by a compared temperature parameter, determine a steady state temperature of the PMSM and the permanent magnets in the PMSM in response of determining that the compared temperature parameter is below a threshold temperature difference.

Thus, that a steady state temperature of the PMSM has been reached may be confirmed. By confirming that a steady state temperature of the PMSM has been reached, the PM flux may be determined for a specific temperature.

According to at least one example embodiment, the PMSM is operated by a current controller, and the first retardation test and/or the second retardation test is performed by accelerating the PMSM to a base speed whereupon a current reference of the current controller is set to zero.

Hereby, at least for the first retardation test, the influence of any magnetic field due to currents in the stator windings can be neglected. Thus, the determination of the PM flux can be improved. That is, by setting the current reference of the current controller to zero, the current fed to the PMSM is zero. The current controller may e.g. be comprised in a controlling apparatus configured to control the operation of the PMSM.

According to at least one example embodiment, the PM flux is determined by a ratio of a voltage reference of the current controller and the electrical angular velocity.

Hereby, a simple yet effective way of determining the PM flux is provided. The electrical angular velocity is for example derived from a position sensor arranged in the rotating shaft of the PMSM (i.e. by derivation of the position by the rotor position sensor). The PM flux may be measured continuously for a period of time during the retardation of the PMSM, and then averaged over that time period. For example, the PM flux may be average from the base speed to a state in which the rotating shaft of the PMSM is close to zero, i.e. almost at a standstill. The base speed may e.g. be 4000-5000 rpm.

According to at least one example embodiment, the no-load power losses are determined by multiplying the loss torque of the PMSM with the mechanical angular velocity.

Hereby, a simple yet effective way of determining the no-load power losses is provided. The mechanical angular velocity may be determined by the position sensor arranged in the rotating shaft of the PMSM. If a controlling apparatus is configured to provide the results of the position sensor in terms of the electrical angular velocity, it should be divided with the number of pole pairs in order to get the mechanical angular velocity.

According to at least one example embodiment, the loss torque is estimated by multiplying the magnitude of acceleration and the moment of inertia of the rotating shaft of the PMSM.

Hereby, a simple yet effective way of determining the loss torque is provided.

The moment of inertia of the rotating shaft may be known beforehand, or it may be estimated by the electromagnetic torque during a torque performance test. During the torque performance test, the PMSM is accelerated to a base speed where after a current (a q-current) is fed to the PMSM in controlled manner in order to decelerate the PMSM to 0, and then again accelerate the PMSM. In more detail, the torque of the unloaded PMSM may be described as:

$$T = T_{em}(i_d, i_q) + T_{loss} = J\frac{d\omega_m}{dt}$$

Where J is the moment of inertia of the rotating shaft, $(d\omega_m)/dt$ is the change of mechanical angular velocity with time, $T_{em}(i_d, i_q)$ is the electromagnetic torque as function of the dq-currents $(i_d, i_q)$, and Toss is the loss torque, $T_{loss}$ changes sign depending on if the PMSM operates as motor or as a generator (i.e. deceleration and acceleration of the PMSM). By measuring the PMSM operating both as a motor and as a generator, and for the same magnitude of mechanical angular velocity, the following relationship can be set up:

$$(T_{em}(i_d, i_q) + T_{loss}) + (T_{em}(i_d, i_q) - T_{loss}) = J\frac{d\omega_m^{motor}}{dt} + \frac{d\omega_m^{generator}}{dt}$$

Where the terms "motor" and "generator" are indicating whether the PMSM operates as a motor or as a generator. Thus, the moment of inertia, J, can be estimated by:

$$J = 2T_{em}\bigg/\left(\frac{d\omega_m^{motor}}{dt} + \frac{d\omega_m^{generator}}{dt}\right)$$

Where the electromagnetic torque $T_{em}$ may be estimated from the linked magnetic, flux as described later, $T_{em} = (i_q*\psi_d - i_d*\psi_q)*1.5*n$, where n is the number of pole pairs. Thus, the no-load power losses, $P_{loss}$, may be determined by the loss torque of the PMSM (estimated by multiplying the magnitude of acceleration and the moment of inertia of the rotating shaft of the PMSM) and the mechanical angular velocity:

$$P_{loss} = J\frac{d\omega_m}{dt}\omega_m$$

According to at least one example embodiment, the magnitude of acceleration is dependent on the PM flux, and the correlation of the PM flux with the no-load power losses in the health parameter of the PMSM includes the dependence of the PM flux and the no-load power losses.

Thus, by the PM flux dependence on the magnitude of acceleration, and the dependence on the magnitude of acceleration on the no-load power losses, the no-load power losses is dependent on the PM flux.

According to at least one example embodiment, the health parameter is multi-valued parameter and the known health parameters of the reference data are corresponding multi-valued parameters.

That is, the health parameter comprises more than one unit or entity. For example, a first health parameter comprises a first value of the PM flux and a first value of the no-load power losses, while a second health parameter comprises a second value of the PM flux and a second value of the no-load power losses, the first and/or the second values of the PM flux and no-load power losses being different.

According to at least one example embodiment, the method comprises
determining whether or not the compared health parameter achieves a pre-set criteria, and categorizing the performance of the PMSM if the health parameter achieves the pre-set criteria.

Hereby, the categorisation may be made conditional based on the pre-set criteria. According to at least one example embodiment, the method may comprise determining whether or not the compared health parameter is smaller than (or larger than) a threshold value, and in response to determining that the compared health parameter is smaller than (or larger than) the threshold value, categorise the performance of the PMSM into a specific categorization.

According to at least one example embodiment, the method comprises
determining whether or not the compared health parameter achieves a pre-set criteria, and categorizing the performance of the PMSM if the health parameter achieves the pre-set criteria, wherein the categorization is related to a reduced performance of the PMSM.

Thus, stated differently, the method comprises determining whether or not the compared health parameter achieves a pre-set criteria, for example determining whether or not the compared health parameter is smaller than (or larger than) a threshold value related to the performance of the PMSM, and categorizing the performance of the PMSM as a reduced performance of the PMSM if the health parameter achieves the pre-set criteria (i.e. is determined as smaller than (or larger than) a threshold value).

Hereby, the PMSM may be categorized at least by its performance, e.g. based on the no-load power losses. If the no-load power losses are relatively large (as compared to the known health parameters of the population of PMSMs) the PMSM may categorized as a low-performance PMSM, and may thus be subject to replacement or service.

According to at least one example embodiment, the PMSM is installed in a vehicle and the method is performed off-line, when the vehicle is at a standstill.

Thus, the off-line performance of the method described herein differ from an on-line performance carried out during normal operation of the PMSM. Normal operation of the PMSM is here referring to an operating in which the PMSM is operated to perform its normal tasks, such as e.g. propelling the vehicle or powering an auxiliary load (e.g. a body-builder load). The off-line performance of the method described herein also differ from an off-line performance carried out prior to installation of the PMSM in the vehicle, such off-line performance being carried out e.g. at the manufacturing site of the PMSM. The method of the invention, in which the PMSM is installed in a vehicle and the method is performed off-line, when the vehicle is at a standstill, may reveal details and performance of the PMSM not possible to reveal prior to installation of the PMSM in the vehicle and/or methods performed on-line.

According to at least one example embodiment, the method comprises:
performing a stand still characterisation of the PMSM to estimate linked magnetic flux as a function of current;
adding the PM flux to the estimated linked magnetic flux to provide a flux characteristic of the PMSM, the flux characteristics being included in the categorization of the performance of the PMSM.
adapting the control parameters of the PMSM based on the flux characteristic.

Hereby, the operation of the PMSM may be improved based on the flux characteristic, by adapting control parameters of the PMSM. For example, the operation of the PMSM with regards to how the currents in the PMSM is controlled may be improved. It should be understood that the adaption of the control parameters may be carried out by adapting at least the current control. The current control may imply update of one or more control parameters of the PMSM. Moreover, the current control may be adapted over time, and may thus comprise a plurality of adaptions of the control parameters. According to at least one example embodiment, the adaptation of the control parameters may be referred to as an adaption of at least one control parameter. According to at least one example embodiment, the adapted control parameter is the current control.

It should be understood that the terms flux linkage, or PM flux, is here referring to the magnetic flux of the permanent magnets when no dependency of the current (i.e. no current in the stator windings), and the linked magnetic flux is here referring to the magnetic flux as a function of current. Both terms may be simply referred to as flux linkage, the former (PM flux) being independent of current and the latter being dependent on the magnetic flux as a function of current.

According to at least one example embodiment, the PM flux, being a single value, is added to at the least the linked magnetic flux on the d-axis of the dq-frame (explained in more detail below). Thus, the operation of the PMSM with dq-currents, results in linked magnetic flux as a function of current along two perpendicular axis, i.e. the d-axis and the q-axis, known to the skilled person.

The linked magnetic flux, $\psi d$, $\psi q$, for a certain step n, as a function of a current (dq-current) may be estimated by:

$$\psi_d{}^n = \psi_d{}^{n-1} + L_d{}^{\Delta,n} \cdot \Delta i_d{}^*$$

$$\psi_q{}^n = \psi_q{}^{n-1} + L_q{}^{\Delta,n} \cdot \Delta i_q{}^*$$

Where the L is the differential inductances given by the impedances (given by the currents and PM flux) multiplied with the sinus value of the phase change, divided by the electrical angular velocity. Thus, the magnetic flux of the PMSM as functions of the d-currents can be estimated at standstill if the PM flux is known or measured. The rotating shaft of the PMSM is prevented from rotating (e.g. by being locked by the gearbox). By combining a DC current with an AC current the dynamic inductance in different operating points can be obtained taking the saturation effects of the iron into account.

In more detail, and according to one example embodiment, the derivation of the differential inductances for different level of saturation may be determined by the following procedure, based on an orthogonal reference frame that spans over 360 electrical degrees (from one north pole to the next), where the so called d-axis is aligned with the permanent magnet flux and the so called q-axis is 90 degrees phase shifted from the PM flux. This reference frame is referred to as the dq-frame.

Specific dq-current references are considered for an appropriate current control procedure: Two DC reference current that saturate the iron (one reference on the d-axis and one on the q-axis); and an AC reference current that oscillates with a predefined frequency on either the d- or the q-axis. The current controller realizes these currents by generating appropriate dq-voltage references to the inverter. To start the estimation of the differential inductances, the DC components of the dq-voltage references from the current controller is removed for the post-processing calculation (e.g. with a high-pass filter). The amplitude of the current and voltage and the phase angle between them (both for d and q) are obtained by e.g. a discrete Fourier transformation. The amplitudes and phase angles are used to derive the different differential inductances. For each combination of DC currents, the algorithm derives four inductances:

$L_d(i_d, i_q)$, which is the scaling factor between the change of d-current and change of the linked magnetic flux on the d-axis, is derived when the AC component of the current is on the d-axis. The inductance is given by the ratio of the amplitude of the d-voltage and current, divided by the angular frequency, and multiplied by the sine of the phase angle.

$L_q(i_d, i_q)$, which is the scaling factor between the change of q-current and change of the linked magnetic flux on the q-axis, is derived when the AC component of the current is on the q-axis. The inductance is given by the ratio of the amplitude of the q-voltage and current, divided by the angular frequency, and multiplied by the sine of the phase angle.

$L_{dq}(i_d, i_q)$, which is the scaling factor between the change of q-current and change of the linked magnetic flux on the d-axis, is derived when the AC component of the current is on the q-axis. The inductance is given by the ratio of amplitude of the d-voltage and q-current, divided by the angular frequency.

$L_{qd}(i_d, i_q)$, which is the scaling factor between the change of d-current and change of the linked magnetic flux on the q-axis, is derived when the AC component of the current is on the d-axis. The inductance is given by the ratio of amplitude of the q-voltage and d-current, divided by the angular frequency.

The differential inductances are obtained for all combinations dq DC currents that are of interest. The differential inductances may then be used to derive the linked magnetic flux for the considered dq-current combinations, for example as described in more detail in the following.

At zero DC currents, the linked magnetic flux in q is zero since the currents are zero and the linked magnetic flux in d is the PM flux. Subsequently, the DC currents change and an appropriate inductance derived as described above is used to estimate how much the linked magnetic flux (both in d and in q) change as function of the current change (the inductance is the scaling factor between the change of current and the change of linked magnetic flux). The linked magnetic flux for the new current combination is saved. Subsequently, the current changes again, and the linked magnetic flux at the new current combination is the flux from the previous current combination plus the change in flux the current step gives rise to. The change in flux is estimated by an appropriate inductance derived as described above. The linked magnetic flux for this specific current combination is saved. Subsequently, the same procedure is repeated for all current combinations as described by the previous steps until the linked magnetic fluxes for all current combinations have been obtained.

According to at least one example embodiment, the categorization of the performance of the PMSM is used for adapting the control parameters the PMSM.

Hereby, the operation of the PMSM may be improved based on the categorisation by adapting control parameters of the PMSM. For example, the control parameters may be compared with reference data of known control parameters of a population of PMSMs. According to at least one example embodiment, the flux characteristic is included in the health parameter for the PMSM.

According to a second aspect of the invention, a computer program comprising program code means for performing the method of the first aspect of the invention, when the program is run on a computer, is provided.

According to a third aspect of the invention, a computer readable medium carrying a computer program comprising program code means for performing the method of the first aspect of the invention, when the program product is run on a computer, is provided.

Effects and features of the second and third aspects of the invention are largely analogous to those described above in connection with the first aspect of the invention. Embodiments mentioned in relation to the first aspect of the invention are largely compatible with the second and third aspects of the invention.

According to a fourth aspect of the invention, a controlling apparatus for controlling the operation of an electric traction machine being a permanent magnetic synchronous motor, PMSM, the PMSM being coupled to a drive shaft, and powered by a battery via an inverter, is provided. The controlling apparatus is configured to:

decouple the PMSM from drive shaft;
perform a first retardation test to measure the flux linkage of the permanent magnets, PM flux, in the PMSM;
perform a second retardation test in which the inverter is disconnected, to measure the no-load power losses of the PMSM;
correlate the PM flux with the no-load power losses in a health parameter of the PMSM, and comparing the health parameter with reference data of known health parameters of a population of PMSMs;
categorize the performance of the PMSM based on the compared health parameter.

According to at least one example embodiment, the controlling apparatus is configured to carry out the method, or any steps of the method, described in relation with the first aspect of the invention. According to at least one example embodiment, the controlling apparatus is programmed with the computer program according to the second aspect of the invention. According to at least one example embodiment, the controlling apparatus comprises a computer readable medium according to the third aspect of the invention.

Thus, effects and features of the fourth aspect of the invention are largely analogous to those described above in connection with the first aspect of the invention. Embodiments mentioned in relation to the first aspect of the invention are largely compatible with the fourth aspect of the invention.

According to at least one example embodiment, the controlling apparatus is further configured to:

provide the flux linkage of the permanent magnets, PM flux, in the PMSM;
perform a stand still characterisation of the PMSM to estimate linked magnetic flux as a function of current;

add the PM flux to the estimated linked magnetic flux to provide a flux characteristic of the PMSM;

adapt the control parameters of the PMSM based on the flux characteristic.

According to a fifth aspect of the invention, an arrangement is provided. The arrangement comprises an electric traction machine being a permanent magnetic synchronous motor, PMSM, the PMSM being connectable to a drive shaft of a vehicle, and configured to be powered by a battery via an inverter, and a controlling apparatus according to the fourth aspect of the invention.

The arrangement may be referred to as an PMSM arrangement.

According to at least one example embodiment, the arrangement comprises a drive shaft configured to transfer motion from the PMSM to the wheels or other propulsion means of the vehicle, and optionally a gear box arrangement between the PMSM and the drive shaft.

According to at least one example embodiment, the arrangement comprises a first temperature sensor arranged in the PMSM, such as in the stator or stator windings of the PMSM, and configured to measure temperature inside the PMSM. According to at least one example embodiment, the arrangement comprises a second temperature sensor arranged outside of the PMSM, e.g. in the drive shaft or in the optional gearbox, and configured to measure temperature outside of the PMSM.

According to a sixth aspect of the invention, a vehicle is provided. The vehicle comprises an arrangement according to the fifth aspect of the invention.

Thus, effects and features of the fifth and six aspects of the invention are largely analogous to those described above in connection with the first aspect of the invention. Embodiments mentioned in relation to the first aspect of the invention are largely compatible with the fifth and sixth aspects of the invention.

The order of the method steps described in the present disclosure is not constrained to that described in the first aspect of the invention. One or several of the steps could switch places, or occur in a different order without departing from the scope of the invention. However, according to at least one example embodiment, the method steps are performed in the consecutive order described in the first aspect of the invention.

Further advantages and features of the present disclosure are disclosed and discussed in the following description and the accompanying drawings.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
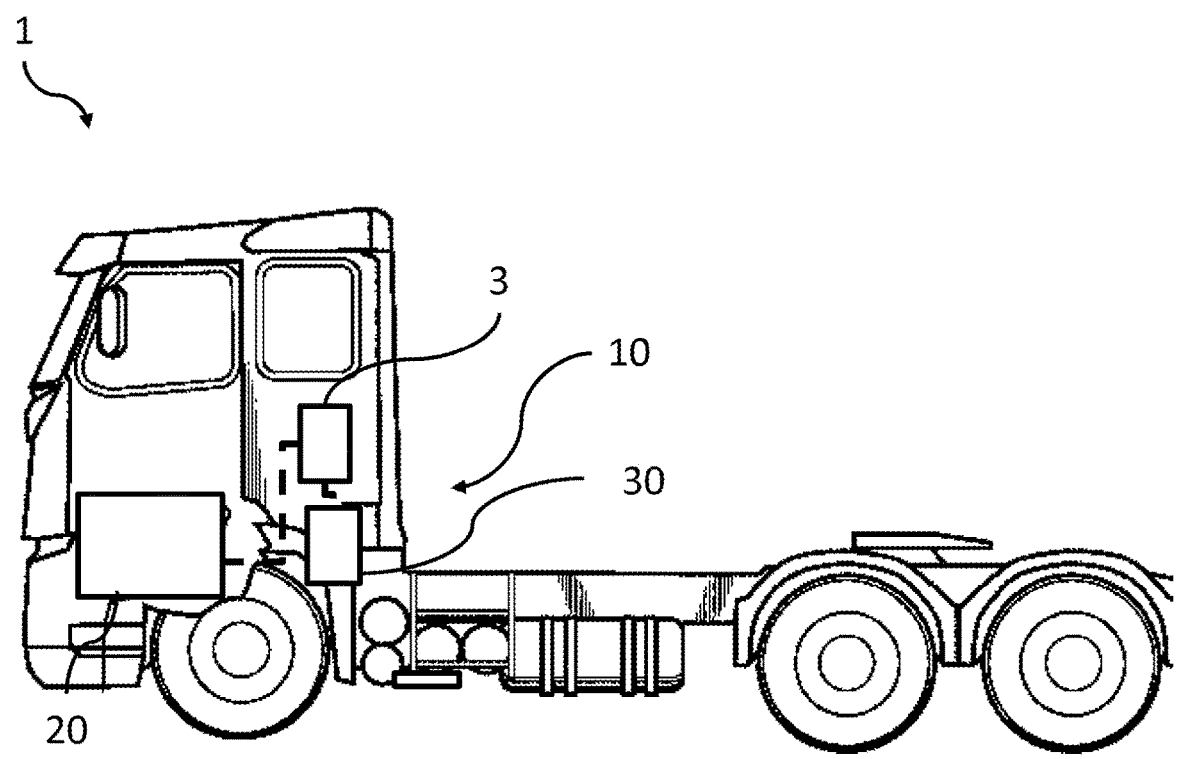
FIG. 1 is a side schematic view of a vehicle in accordance with an example embodiment of the invention.

With reference to FIG. 1, a vehicle 1, here embodied as a heavy duty truck 1, is disclosed for which a method, a permanent magnetic synchronous motor, PMSM, 20, and/or a PMSM arrangement 10 of a kind disclosed in the present invention is advantageous. However, the method, PMSM 20 or PMSM arrangement 10 may as well be implemented in other types of vehicles, such as in busses, light-weight trucks, passenger cars, marine applications etc. The vehicle 1 is an electric vehicle, such as a full electric vehicle or a hybrid, comprising at least one electric machine 20 being a PMSM, an energy storage system 30 comprising energy storage or energy transformation devices, typically batteries or fuel cells, the energy storage system 30 being arranged and configured to power the PMSM 20, typically via a DC-AC converter (inverter). The vehicle 1 typically further comprises other parts of the powertrain such as transmission, drive shafts and wheels (not shown in detail in FIG. 1). As seen in FIG. 1, the PMSM 20 is controlled by a controlling apparatus 3, e.g. being comprised in an ECU of the vehicle 1.

Figure 2A:
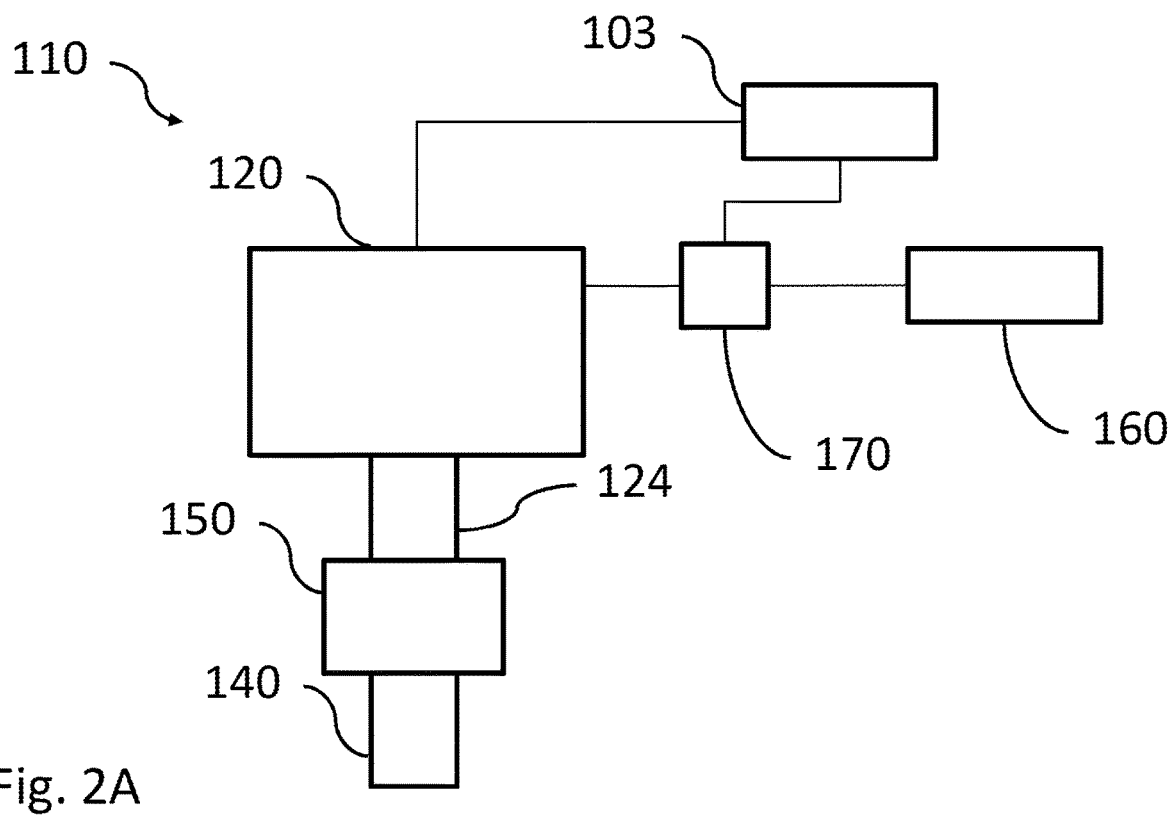
FIG. 2A is a schematic view of a PMSM arrangement comprising a PMSM and a controlling apparatus in accordance with an example embodiment of the invention.

FIG. 2A is a schematic view of a PMSM arrangement 110 comprising an electric traction machine 120 being a permanent magnetic synchronous motor, PMSM, 120. The PMSM arrangement 110 and the PMSM 120 may for example correspond to the PMSM arrangement 10 and PMSM 20 of vehicle 1 in FIG. 1. The PMSM 120 is connected to a drive shaft 140 of the vehicle, and in FIG. 2A to an optional gear box 150. The drive shaft 140 is typically configured to transfer motion from the PMSM 120 to the wheels or other propulsion means of the vehicle, via the gear box 150. Hereby, the PMSM 120 is configured to propel the vehicle. Moreover, the PMSM 120 is powered by at least one battery 160 or other energy storage or energy transformation device, via an inverter 170, such as a DC-AC converter. The operation of the PMSM 120 is controlled by a controlling apparatus 103, corresponding e.g. to the controlling apparatus 3 of FIG. 1. The controlling apparatus 103 typically comprises a current controller configured to control the current supplied by the battery 160 via the inverter 170 to the PMSM 120.

Figure 2B:
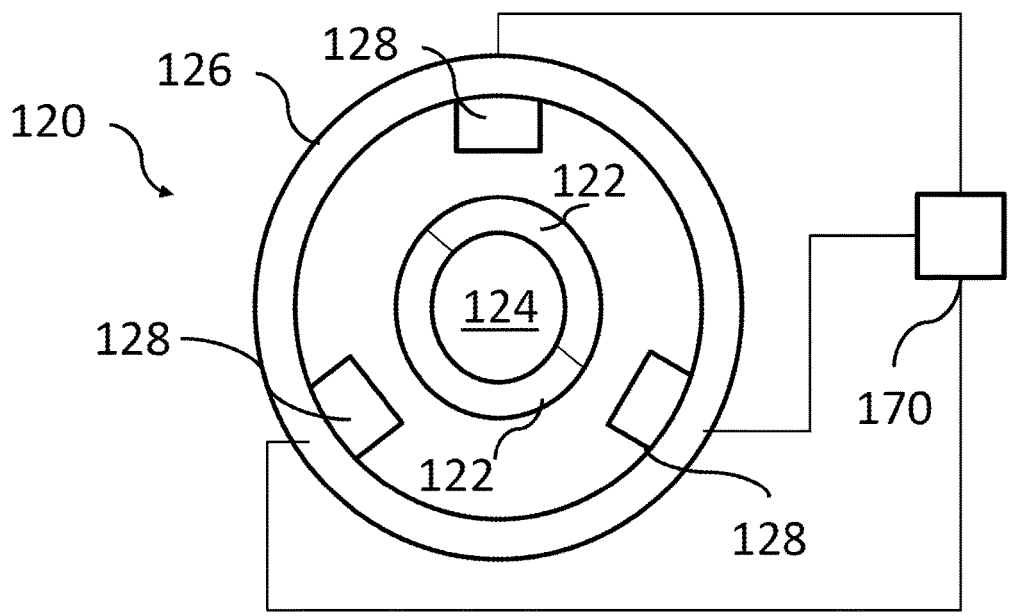
FIG. 2B is an enlarged view of a cross section of the PMSM in FIG. 2A.

In FIG. 2B, a cross section of the PMSM 120 is shown. Here, the permanent magnets 122 of the rotating shaft 124 is shown, as well as the stator 126 and stator windings 128. The controlling apparatus 103 is configured to control at least the current fed to the stator winding 128, via the inverter 170, in a manner known to the skilled person. The illustration of the PMSM 120 in FIG. 2B is schematic, and other types of configurations of the PMSM is within the scope of the invention.

A method for categorizing performance of a PMSM, such as the PMSM 20, 120 of FIGS. 1, 2A, and 2B will now be described in detail with reference to the flow chart of FIG. 3. The PMSM is assumed to be coupled to a drive shaft, such as drive shaft 140 of FIG. 2A, and powered by a battery via an inverter, such as battery 160 and inverter 170 of FIG. 2A. Thus, the method is performed for the PMSM installed in a vehicle and is performed off-line, when the vehicle is at a standstill.

In an optional step S1, e.g. being a first step S1, a steady state temperature for the permanent magnets in the PMSM is determined. The optional first step S1 may e.g. be performed by the following sub-steps: In a first sub-step S3, the temperature inside of the PMSM, e.g. in the stator windings of the PMSM, and the temperature outside of the PMSM, e.g. in the drive shaft or gearbox, are determined (e.g. measured). The temperature outside of the PMSM is measured at least somewhere along the power train, downstream of the PMSM, but typically upstream of the propulsion means such as the wheels, e.g. along the transmission.

In a second sub-step S5, the measured temperatures inside and outside of the PMSM are compared by a compared temperature parameter. The compared temperature parameter may simply be represented by any difference between the measured temperatures inside and outside of the PMSM.

In a third sub-step S7, a steady state temperature of the PMSM and the permanent magnets in the PMSM is determined in response of determining that the compared temperature parameter is below a threshold temperature difference. That is, if the difference between the measured temperatures inside and outside of the PMSM is lower than a set threshold value, e.g. by 2° C., a steady state temperature of the PMSM and the permanent magnets is assumed to be achieved.

In a step S10, being e.g. a second step S10, the PMSM is decoupled from the drive shaft. This may e.g. be carried out by a decoupling in the gear box.

In a step S20, being e.g. a third step S20, a first retardation test is performed to measure the flux linkage of the permanent magnets, PM flux, in the PMSM. The permanent magnets are e.g. shown in FIG. 2B. The first retardation test is typically performed by accelerating the PMSM to a base speed, e.g. 4000-5000 rpm, by a current controller (the current controller typically being comprised in a controlling apparatus configured to control the operation of the PMSM and the powering thereof by the battery, such as the controlling apparatus 3, 103 of FIGS. 1-2), whereupon a current reference of the current controller is set to zero. As the current reference is set to zero, the PMSM will decelerate, eventually to a standstill. The flux linkage is measured as described earlier in the text.

In a step S30, being e.g. a fourth step S30 which is typically performed subsequent to step S20, a second retardation test is performed in which the inverter is disconnected, to measure the no-load power losses of the PMSM. Correspondingly to the first retardation test, the second retardation test is typically performed by accelerating the PMSM to a base speed, e.g. 4000-5000 rpm, by a current controller powering the PMSM by the battery, whereupon a current reference of the current controller is set to zero and the inverter is disconnected and/or by simply disconnecting the inverter whereby the current to the PMSM automatically will drop to zero. The inverter may be disconnected from the PMSM by a switching arrangement known in the art. As the current the PMSM is zero, the PMSM will decelerate, eventually to a standstill. The no-load power losses of the PMSM is performed as described earlier in the text, and is only briefly summarized here. The PM flux may be determined by a ratio of a voltage reference of the current controller and the electrical angular velocity. The latter may e.g. be determined by a position sensor in the rotating shaft of the PMSM. Moreover, the no-load power losses may be determined by multiplying a loss torque of the PMSM with the mechanical angular velocity, wherein the loss torque is estimated by multiplying the magnitude of acceleration and the moment of inertia of the rotating shaft of the PMSM, the moment of inertia may be known or estimated as described earlier in the text.

In a step S40, being e.g. a fifth step S40, the PM flux is correlated with the no-load power losses in a health parameter of the PMSM. This step is preferably carried out by the controlling apparatus, and the health parameters saved in a memory linked to the controlling apparatus. The health parameter may e.g. be multi-valued parameter comprising at least the PM flux and the no-load power losses as separate values, possibly together with and ID reference of the PMSM and the temperature present when performing the first and/or second retardation test. As the magnitude of acceleration is dependent on the PM flux, the correlation of the PM flux with the no-load power losses in the health parameter of the PMSM includes the dependence of the PM flux and the no-load power losses.

In a step S50, being e.g. a sixth step S50, the health parameter is compared with reference data of known health parameters of a population of PMSMs. The population of PMSM preferably comprises health parameters of corresponding PMSMs, e.g. at least 10, or 50 PMSMs. The known health parameters preferably correspond to the health parameter of the PMSM in the sense that they are set up in a corresponding manner, and comprises at least the PM flux and no-load power losses, possibly together with temperature data.

In a step S60, being e.g. a seventh step S60, the performance of the PMSM is categorized based on the compared health parameter. That is, by comparing the health parameter of the PMSM with the known health parameters of corresponding PMSMs, the corresponding PMSMs being categorized based at least its health parameter (for example categorized as "normal performance" for PMSMs with a health parameter indicating normal performance, and categorized as "reduced performance" for PMSMs with a health parameter indicating reduced performance. Hereby, the PMSM may at least be categorised based on if it operates according to normal performance or reduced performance.

In a step S70, being e.g. an eight step S70, it is determined whether or not the compared health parameter achieves a pre-set criteria. The pre-set criteria may e.g. be based on whether or not the compared health parameter is smaller or larger than a certain pre-set threshold value.

In a step S80, being e.g. a ninth step S80, the performance of the PMSM is categorized based on if the health parameter achieves the pre-set criteria or not. For example, the categorization may relate to a reduced performance of the PMSM as earlier descried.

In a step S90, being e.g. a tenth step S90, which may be performed anytime during the method, a stand still characterisation of the PMSM is performed to estimate linked magnetic flux ($\psi d$, $\psi q$) as a function of current. The linked magnetic flux may be determined as earlier described in the text.

In a step S100, being e.g. an eleventh step S100, which may be performed subsequent to step S90 and step S20, the PM flux is added to the estimated linked magnetic flux to provide a flux characteristic of the PMSM. The flux characteristics may be included in the categorization of the performance of the PMSM, and e.g. in the health parameter of the PMSM. The PM flux, being a single value, is added to at the least the linked magnetic flux of the d-axis.

In a step S110, being e.g. a twelfth step S110, which is performed subsequent to step S100, the control parameters of the PMSM is adapted based on the flux characteristic. This may e.g. be achieved by the controlling apparatus 3, 103 and the current controller thereof. Thus, as the flux characteristics may be included in the categorization of the performance of the PMSM, the categorization of the performance of the PMSM may be used for adapting the control parameters the PMSM.

Figure 3:
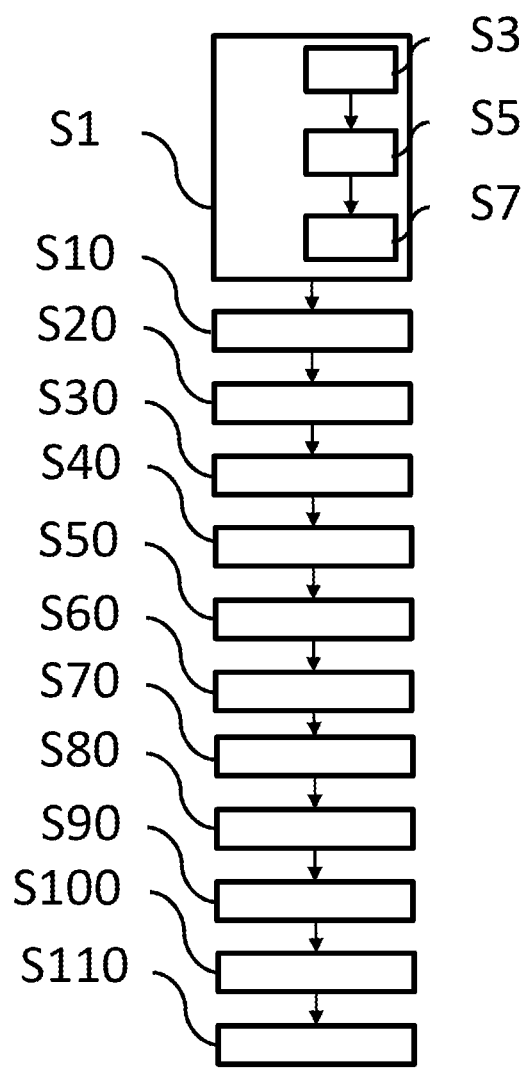
FIG. 3 is a flowchart illustrating the steps of a method in accordance with example embodiments of the invention.

The order of the steps in the method of FIG. 3 described in the foregoing embodiments is merely an example, and is not necessarily limited to the order described. The order of steps may be switched, and parts of some steps may be omitted as well.

Turning back to FIG. 2A, the controlling apparatus 103 may be configured to perform the method, or any of the steps, described with reference to FIG. 3. Thus, the controlling apparatus 103 may be configured to at least:

decouple the PMSM 120 from drive shaft 150, as described with reference to step S10 of FIG. 3;

perform a first retardation test to measure the flux linkage of the permanent magnets 122, PM flux, in the PMSM 120, as described with reference to step S20 of FIG. 3;

perform a second retardation test in which the inverter 170 is disconnected, to measure the no-load power losses of the PMSM 120, as described with reference to step S30 of FIG. 3;

correlate the PM flux with the no-load power losses in a health parameter of the PMSM 120, and comparing the health parameter with reference data of known health parameters of a population of PMSMs, as described with reference to step S40 and S50 of FIG. 3 categorize the performance of the PMSM based on the compared health parameter, as described with reference to step S60 of FIG. 3.

It is to be understood that the present invention is not limited to the embodiments described above and illustrated in the drawings; rather, the skilled person will recognize that many changes and modifications may be made within the scope of the appended claims.

Additionally, variations to the disclosed embodiments can be understood and effected by the skilled person in practicing the claimed inventive concept, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

It should be understood that the controlling apparatus 3, 103 may not need to be one single unit, but its functionality may be divided into different, separate, control units or controlling apparatus, and some functionality may naturally be performed as calculations in a remote server or by cloud computing. Those skilled in the art will also appreciate that the controlling apparatus 3, 103 may refer to a combination of analog and digital circuits, and/or one or more processors configured with program software and/or firmware, e.g. stored in a memory, that when executed by the one or more processors perform the one or more of the steps described in conjunction with FIG. 3. One or more of these processors, as well as the other digital hardware, may be included in a single ASIC (Application-Specific Integrated Circuitry), or several processors and various digital hardware may be distributed among several separate components, whether individually packaged or assembled into a SoC (System-on-a-Chip).

The invention claimed is:

1. A method for categorizing performance of an electric traction machine being a permanent magnetic synchronous motor, PMSM, the PMSM being coupled to a drive shaft, and powered by a battery via an inverter, the method comprising:

decoupling the PMSM from drive shaft;

performing a first retardation test to measure the flux linkage of the permanent magnets, PM flux, in the PMSM;

performing a second retardation test in which the inverter is disconnected, to measure the no-load power losses of the PMSM;

correlating the PM flux with the no-load power losses in a health parameter of the PMSM, and comparing the health parameter with reference data of known health parameters of a population of PMSMs;

categorizing the performance of the PMSM based on the compared health parameter.

2. The method according to claim 1, comprising:
prior to the first retardation test, determining a steady state temperature for the permanent magnets in the PMSM.

3. The method according to claim 2, comprising:
measuring the temperature inside of the PMSM;
comparing the measured temperatures inside and outside of the PMSM by a compared temperature parameter,
determine a steady state temperature of the PMSM and the permanent magnets in the PMSM in response of determining that the compared temperature parameter is below a threshold temperature difference.

4. The method according to claim 1, wherein the PMSM is operated by a current controller, and wherein the first retardation test and/or the second retardation test is performed by accelerating the PMSM to a base speed whereupon a current reference of the current controller is set to zero.

5. The method according to claim 4, wherein the PM flux is determined by a ratio of a voltage reference of the current controller and the electrical angular velocity.

6. The method according to claim 1, wherein the no-load power losses are determined by multiplying the loss torque of the PMSM with the mechanical angular velocity.

7. The method according to claim 6, wherein the loss torque is estimated by multiplying the magnitude of acceleration and the moment of inertia of the rotating shaft of the PMSM.

8. The method according to claim 6, wherein the magnitude of acceleration is dependent on the PM flux, and the correlation of the PM flux with the no-load power losses in the health parameter of the PMSM includes the dependence of the PM flux and the no-load power losses.

9. The method according to claim 1, wherein the health parameter is multi-values parameter and the known health parameters of the reference data are corresponding multi-values parameters.

10. The method according to claim 1, comprising:
determining whether or not the compared health parameter achieves a pre-set criteria, and categorizing the performance of the PMSM if the health parameter achieves the pre-set criteria, wherein the categorization is related to a reduced performance of the PMSM.

11. The method according to claim 1, wherein the PMSM is installed in a vehicle and the method is performed off-line, when the vehicle is at a standstill.

12. The method, comprising:
performing a stand still characterisation of the PMSM to estimate linked magnetic flux as a function of current;
adding the PM flux to the estimated linked magnetic flux to provide a flux characteristic of the PMSM, the flux characteristics being included in the categorization of the performance of the PMSM;
adapting the control parameters of the PMSM based on the flux characteristic.

13. The method according to claim 12, wherein the categorization of the performance of the PMSM is used for adapting the control parameters the PMSM.

14. A non-transitory computer readable medium storing a computer program comprising program code for performing the method of claim 1, when the program code is run on a computer.

15. A controlling apparatus for controlling the operation of an electric traction machine being a permanent magnetic synchronous motor, PMSM, the PMSM being coupled to a drive shaft, and powered by a battery via an inverter, the controlling apparatus being configured to:

decouple the PMSM from drive shaft;

perform a first retardation test to measure the flux linkage of the permanent magnets, PM flux, in the PMSM;

perform a second retardation test in which the inverter is disconnected, to measure the no-load power losses of the PMSM correlate the PM flux with the no-load power losses in a health parameter of the PMSM, and comparing the health parameter with reference data of known health parameters of a population of PMSMs;

categorize the performance of the PMSM based on the compared health parameter.

16. An arrangement comprising:

an electric traction machine being a permanent magnetic synchronous motor, PMSM, the PMSM being connectable to a drive shaft of a vehicle, and configured to be powered by a battery via an inverter, and a controlling apparatus according to claim 15.

17. A vehicle comprising an arrangement according to claim 16.

18. The method according to claim 3, wherein measuring the temperature includes measuring the temperature in the stator windings of the PMSM, and the temperature outside of the PMSM and in the drive shaft or gearbox.

\* \* \* \* \*